US008203212B2

(12) United States Patent
Anderson et al.

(10) Patent No.: US 8,203,212 B2
(45) Date of Patent: Jun. 19, 2012

(54) AIR GAPS IN A MULTILAYER INTEGRATED CIRCUIT AND METHOD OF MAKING SAME

(75) Inventors: Brent A. Anderson, Jericho, VT (US); Edward J. Nowak, Essex Junction, VT (US); Jed H. Rankin, South Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 222 days.

(21) Appl. No.: 12/752,369

(22) Filed: Apr. 1, 2010

(65) Prior Publication Data

US 2011/0241220 A1 Oct. 6, 2011

(51) Int. Cl.
*H01L 23/552* (2006.01)
(52) U.S. Cl. .. 257/776; 257/773; 257/774; 257/E23.143
(58) Field of Classification Search .......... 257/773–774, 257/776, E29.143
See application file for complete search history.

(56) References Cited

U.S. PATENT DOCUMENTS

| | | | |
|---|---|---|---|
| 5,949,143 A | 9/1999 | Bang | |
| 6,057,226 A | 5/2000 | Wong | |
| 6,211,057 B1 | 4/2001 | Lin et al. | |
| 6,346,484 B1 | 2/2002 | Cotte et al. | |
| 6,376,330 B1 | 4/2002 | Fulford et al. | |
| 6,380,106 B1 | 4/2002 | Lim et al. | |
| 6,492,732 B2 | 12/2002 | Lee et al. | |
| 6,984,577 B1 | 1/2006 | Zhao et al. | |
| 7,067,421 B2 | 6/2006 | Ahn et al. | |
| 7,096,449 B1 | 8/2006 | Teig et al. | |
| 7,098,476 B2 | 8/2006 | Babich et al. | |
| 7,370,307 B2 | 5/2008 | Seta | |
| 2004/0097065 A1 | 5/2004 | Lur et al. | |
| 2008/0120583 A1 | 5/2008 | Fujii et al. | |
| 2008/0124917 A1 | 5/2008 | Oh et al. | |
| 2009/0263951 A1 * | 10/2009 | Shibata et al. | 438/422 |

* cited by examiner

*Primary Examiner* — Cuong Q Nguyen
*Assistant Examiner* — Tran Tran
(74) *Attorney, Agent, or Firm* — Gibb I.P. Law Firm, LLC; Richard M. Kotulak, Esq.

(57) ABSTRACT

A multilayer integrated circuit (IC) including a cross pattern of air gaps in a wiring layer and methods of making the multilayer IC are provided. The patterning of the air gaps is independent of the wiring layout. Patterns of air gaps including: parallel alternating stripes of air gaps and dielectric that are orthogonal to a uni-directional metal wiring layout; parallel alternating stripes of air gaps and dielectric that are diagonal to either a uni- or bi-directional metal wiring layout; and a checkerboard pattern of air gaps and dielectric that crosses either a uni- or bi-directional metal wiring layout are easily formed by conventional photolithography and provide a comparatively uniform reduction in parasitic capacitance between the wires and the surrounding materials, when about one-half of a total length of the metal wiring layout is disposed within the air gaps.

7 Claims, 6 Drawing Sheets

720  740  730

AIR GAPS IN A MULTILAYER INTEGRATED CIRCUIT AND METHOD OF MAKING SAME

BACKGROUND

1. Field of the Invention

The exemplary embodiments of the invention generally relate to cross patterns of air gaps in a wiring layer of a multilayer integrated circuit (IC) and the making of same. More specifically, exemplary embodiments of the invention relate to cross patterns of air gaps that are independent of the wiring layout, are easily produced by conventional photolithography, and provide a comparatively uniform reduction of parasitic capacitance.

2. Description of the Related Art

Wiring layers within multilayer IC chips interconnect various circuit components, ground terminals and power terminals of underlying and/or overlying layers by patterned layouts of metal wiring. Within a wiring layer, metal wiring of a particular path is electrically insulated from other metal wiring paths by an intra-layer dielectric, while individual wiring layers are separated from each other by an inter-layer dielectric. Electrically conductive vias are formed in the inter-layer dielectric to provide electrical connections between the wiring layer and other layers.

The placement of metal wiring paths for a wiring layer is conventionally accomplished by computerized wiring layout rules used in design of the multilayer IC. Wiring layout rules can comprise uni-directional wiring layout rules, in which individual wires connecting various circuit components, ground terminals, or power terminals to the underlying and/or overlying layers are laid out in a single direction that corresponds to one of the planar axes of the wiring layer, or bi-directional wiring layout rules, in which the individual wires are laid out according to two directions that correspond to the two orthogonal planar axes of the wiring layer, and can include right angles formed by the two directions.

Different dielectric and wiring materials, and the layout of wiring paths substantially affect signal propagation delays along the wiring paths, and thus, the integrated circuit's performance. Signal propagation delays are due to RC time constants, where R is the resistance of the wiring path, and C is the effective capacitance between the wiring path and surrounding materials in the multilayer IC. RC time constants can be reduced by lowering the specific resistance of the wiring material, and/or by using inter-layer and intra-layer dielectrics (ILDs) with low dielectric constants.

Conventional, low RC wiring layers frequently use copper metal for the wiring paths and silicon dioxide for the intra-layer and inter-layer dielectrics. Silicon dioxide has a relatively low dielectric constant, k, of about 4.0. Alternative, low k dielectrics include carbon-based solids, such as diamond-like carbon (DLC), fluorinated DLC, SiCO and SiCOH compounds, and organic or inorganic polymer dielectrics. Air gaps, however, have the lowest k of any material, i.e., $k \approx 1.00$, in which the air gap may include air, a gas, or vacuum.

Air gaps are conventionally formed in the intra-layer dielectric material of a wiring layer by one of two methods: 1) patterned sacrificial material is formed within the wiring layer and is subsequently removed from beneath an overlying permeable bridge layer by diffusion upon low temperature oxidation, leaving a cavity defining the air gap; and 2) patterned sacrificial material is formed within the wiring layer and subsequently removed from beneath an overlying perforated bridge layer by an aggressive process, for example, plasma-etching by a reactive gas, via perforation(s) of the bridge layer, and then pinching-off of the perforation(s) of the bridge layer, forming a cavity defining the air gap.

FIGS. 1A-1B and 2A-2C illustrate, in cross-sectional view, two conventional methods that are used to form air gaps. In particular, FIGS. 1A-1B illustrate forming an air gap in a cavity bounded by a substrate 10, conductors 20, and a permeable bridge layer 30. Upon, for example, low temperature oxidation, the sacrificial material 40 in FIG. 1A forms volatiles, which then diffuse through permeable bridge layer 30 to form air gap 50 of FIG. 1B. FIGS. 2A-2C illustrate forming an air gap in a structure containing a perforated bridge layer 60 with a perforation 70. The sacrificial material 40 in FIG. 2A is removed via the perforation 70 to form the air gap 80 in FIG. 2B by an aggressive process, for example, plasma-etching by a reactive gas. Perforation 70 may then be pinched-off by depositing an overlying dielectric layer 90 to form the air gap of FIG. 2C.

The method by which the sacrificial material is removed depends on: the particular sacrificial material employed; the other materials in the wiring layer, to which the particular sacrificial material removal process must be selective; and whether the bridge layer is permeable or possesses perforations.

Various sacrificial materials and removal methods include poly(methyl methacrylate) (PMMA) and Parylene™, i.e., poly-para-xylylene, which may be removed by organic solvents, oxygen ashing, and/or low temperature ($\approx 200°$ C.) oxidation, and norborene-based materials such as BF Goodrich's Unity™ Sacrificial Polymer, which may be removed by low temperature (350-400° C.) thermal decomposition into volatiles. In the case of Unity™, diffusion of the volatiles through a bridge layer can occur for silicon dioxide bridge layers of approximately 500 nm thickness.

Conventionally, air gaps in wiring layers generally follow wiring layout rules to produce air gaps aligned along the lengths of wires to reduce parasitic capacitance. Thus, the analysis of reduced capacitance in conventionally formed air gaps is relatively complex, depending inter alia on the length and geometry of particular wiring paths, the distance between a wire of the particular wiring paths to surrounding conductors and semiconductors, and the size and geometry of individual air gaps surrounding each of the wires. In addition, because conventionally formed air gaps are aligned along the lengths of the various wires in a wiring layer, the photolithographic patterning of these air gaps is relatively complex.

SUMMARY

There remains a need to generate patterns of air gaps in a wiring layer that are independent of the wiring layout, are easily produced by conventional photolithography, and provide a uniform reduction of parasitic capacitance.

In view of the foregoing, an exemplary embodiment of the invention disclosed herein provides a multilayer integrated circuit (IC) including a cross pattern of air gaps in a wiring layer, in which the multilayer IC includes: a first wiring layer disposed over a first substrate, the first wiring layer extending in a first direction and in a second direction orthogonal to the first direction in a plan view, the first wiring layer including: a first pattern of parallel, alternating stripes of air gaps and dielectric of approximately equal widths extending across the first wiring layer in the first direction; and wires laid out in the second direction, wherein each of the wires replaces portions of the first pattern of parallel, alternating stripes of air gaps and dielectric in the first wiring layer.

In another embodiment of the invention, the multilayer IC further includes a first bridge layer, which caps the first wiring layer.

In yet another embodiment of the invention, the first substrate of the multilayer IC includes: a first interlevel dielectric layer including a via; and a first lower layer disposed beneath the first interlevel dielectric layer and including any of a power terminal, a ground terminal, and a terminal of an electronic device.

In yet another embodiment of the invention, the multilayer IC further includes a second substrate disposed over the first bridge layer; and a second wiring layer disposed over the second substrate, the second wiring layer including: a second pattern of parallel, alternating stripes of air gaps and dielectric of approximately equal widths extending across the second wiring layer in the second direction; and wires laid out in the first direction, wherein each of the wires replaces portions of the second pattern of parallel, alternating stripes of air gaps and dielectric in the second wiring layer.

In yet another embodiment of the invention, the multilayer IC further includes a second bridge layer, which caps said second wiring layer.

In yet another embodiment of the invention, the second substrate of the multilayer IC includes: a second interlevel dielectric layer including a via; and a second lower layer disposed beneath the second interlevel dielectric layer and including any of a power terminal, a ground terminal, and a terminal of an electronic device.

In yet another exemplary embodiment of the invention disclosed herein, a multilayer integrated circuit (IC) including a cross pattern of air gaps in a wiring layer, includes: a first wiring layer disposed over a first substrate, the first wiring layer extending in a first direction and in a second direction orthogonal to the first direction in a plan view, the first wiring layer including: a first diagonal pattern of parallel, alternating stripes of air gaps and dielectric of approximately equal widths extending across the first wiring layer diagonally to the first direction; and wires laid out in the first direction, the second direction, or in right angles extending in the first and the second directions, wherein each of the wires replaces portions of the first diagonal pattern of parallel, alternating stripes of air gaps and dielectric in the first wiring layer.

In yet another embodiment of the invention, the first diagonal pattern of parallel, alternating stripes of air gaps and dielectric of the multilayer IC forms an angle to the first direction of approximately of approximately plus or minus 45°.

In yet another embodiment of the invention, the multilayer IC further includes a first bridge layer, which caps the first wiring layer.

In yet another embodiment of the invention, the first substrate of the multilayer IC includes: a first interlevel dielectric layer including a via; and a first lower layer disposed beneath the first interlevel dielectric layer and including any of a power terminal, a ground terminal, and a terminal of an electronic device.

In yet another embodiment of the invention, the multilayer IC further includes: a second substrate disposed over the first bridge layer; and a second wiring layer disposed over the second substrate, the second wiring layer including: a second diagonal pattern of parallel, alternating stripes of air gaps and dielectric of approximately equal widths extending across the second wiring layer and being oriented orthogonally to the first diagonal pattern; and wires laid out in the first direction, the second direction, or in right angles extending in the first and the second directions, wherein each of the wires replaces portions of the second diagonal pattern of parallel, alternating stripes of air gaps and dielectric in the second wiring layer.

In yet another embodiment of the invention, the multilayer IC further includes a second bridge layer, which caps the second wiring layer.

In yet another embodiment of the invention, the second substrate of the multilayer IC includes: a second interlevel dielectric layer including a via; and a second lower layer disposed beneath the second interlevel dielectric layer and including any of a power terminal, a ground terminal, and a terminal of an electronic device.

In yet another exemplary embodiment of the invention, a multilayer integrated circuit (IC) including a cross pattern of air gaps in a wiring layer, includes: the wiring layer being disposed over a substrate, the wiring layer extending in a first direction and in a second direction orthogonal to the first direction in a plan view, the wiring layer including: a checkerboard pattern of alternating squares of air gaps and dielectric of approximately equal sizes; and wires laid out in the first direction, the second direction, or in right angles extending in the first and the second directions, wherein each of the wires replaces portions of the checkerboard pattern of alternating squares of air gaps and dielectric in the wiring layer.

In yet another embodiment of the invention, the multilayer IC further includes a bridge layer, which caps the wiring layer.

In yet another embodiment of the invention, the substrate of the multilayer IC includes: an interlevel dielectric layer including a via; and a lower layer disposed beneath the interlevel dielectric layer and including any of a power terminal, a ground terminal, and a terminal of an electronic device.

In yet another exemplary embodiment of the invention, a method of making a multilayer integrated circuit (IC) including a cross pattern of air gaps in a wiring layer is provided. The method including: forming a dielectric layer on a substrate, the dielectric layer extending in a first direction and in a second direction orthogonal to the first direction in a plan view; etching the dielectric layer to form a regular pattern of one of: parallel, alternating stripes of trenches and dielectric of approximately equal widths extending across the dielectric layer in the first direction; parallel, alternating stripes of trenches and dielectric of approximately equal widths extending across the dielectric layer diagonally to the first direction; and a checkerboard pattern of alternating squares of trenches and dielectric of approximately equal sizes; depositing a sacrificial material in the trenches; etching a metal wiring layout in portions of the sacrificial material and the dielectric: in the second direction according to a uni-directional wiring layout rule, if the parallel, alternating stripes of trenches and dielectric are etched in the first direction; or in the first direction or the second direction according to a uni-directional wiring layout rule, or in the first direction and the second direction according to a bi-directional wiring layout rule, if the parallel, alternating stripes of trenches and dielectric are etched diagonally to the first direction, or the alternating, squares of trenches and dielectric are etched in the checkerboard pattern, wherein about half of a total length of the metal wiring layout is disposed in etched portions of the sacrificial material; depositing a metal in the metal wiring layout; forming a bridge layer over the metal, the sacrificial material, and the dielectric; and removing the sacrificial material from beneath the bridge layer to form the cross pattern of air gaps in the wiring layer.

In yet another embodiment of the making of the invention, the substrate of the multilayer IC includes: an interlevel dielectric layer including a via; and a lower layer disposed beneath the interlevel dielectric layer and including any of a power terminal, a ground terminal, and a terminal of an electronic device.

In yet another exemplary embodiment of the invention, a method of making a multilayer integrated circuit (IC) including a cross pattern of air gaps in a wiring layer is provided. The method including: forming a dielectric layer on a substrate, the dielectric layer extending in a first direction and in a second direction orthogonal to the first direction in a plan view; etching the dielectric layer to form a metal wiring layout within the dielectric layer, wherein the metal wiring layout is patterned according to one of: a uni-directional wiring layout rule; and a bi-directional wiring layout rule; depositing a metal in the metal wiring layout to form the wiring layer of wires and dielectric; etching only portions of dielectric of the wiring layer to form a regular pattern of one of: parallel, alternating stripes of trenches and dielectric of approximately equal widths extending across the wiring layer in a direction orthogonal to the uni-directional wiring layout rule, if the metal wiring layout is patterned according to the uni-directional wiring layout rule; and parallel, alternating stripes of trenches and dielectric of approximately equal widths extending across the dielectric layer diagonally to the first direction, or a checkerboard pattern of alternating squares of trenches and dielectric, if the metal wiring layout is patterned according to the uni-directional wiring layout rule or to the bi-directional wiring layout rule; depositing a sacrificial material in the trenches; forming a bridge layer over the metal, the sacrificial material, and the dielectric; and removing the sacrificial material from beneath the bridge layer to form the cross pattern of air gaps in the wiring layer, wherein about half of a total length of the metal wiring layout is disposed within the cross pattern of air gaps.

In yet another embodiment of the making of the invention, the substrate of the multilayer IC includes: an interlevel dielectric layer including a via; and a lower layer disposed beneath the interlevel dielectric layer and including any of a power terminal, a ground terminal, and a terminal of an electronic device.

BRIEF DESCRIPTION OF THE DRAWINGS

The exemplary embodiments of the invention will be better understood from the following detailed description with reference to the drawings, which are not necessarily drawing to scale and in which:

FIGS. 1A-1B are schematic diagrams illustrating a prior art method of forming an air gap, in which FIG. 1A shows a sacrificial material being removed from beneath a permeable bridge layer to form the air gap 50 in FIG. 1B in an exemplary embodiment of the invention;

FIGS. 2A-2C are schematic diagrams illustrating a prior art method of forming an air gap, in which FIG. 2A shows a sacrificial material being removed from beneath a bridge layer having a perforation by an aggressive process, FIG. 2B shows the forming of the air gap 80, and FIG. 2C shows the capping of the perforated bridge layer overlying the air gap in an exemplary embodiment of the invention;

DETAILED DESCRIPTION OF EXEMPLARY EMBODIMENTS

Figure 1A:
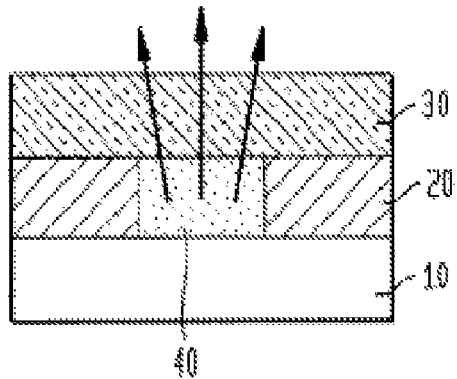
Figure 1B:
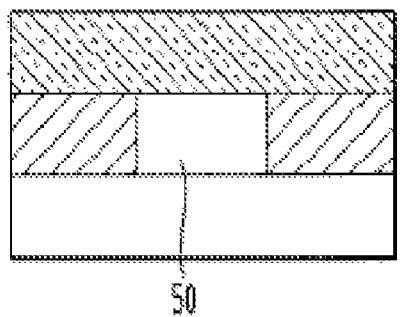
Figure 2A:
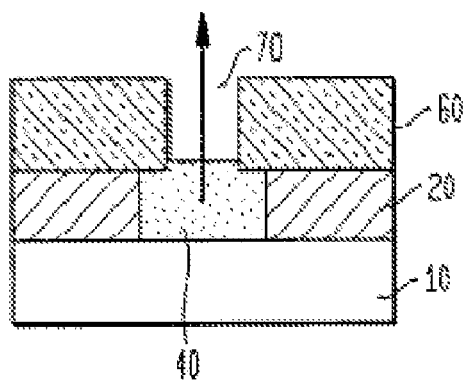
Figure 2B:
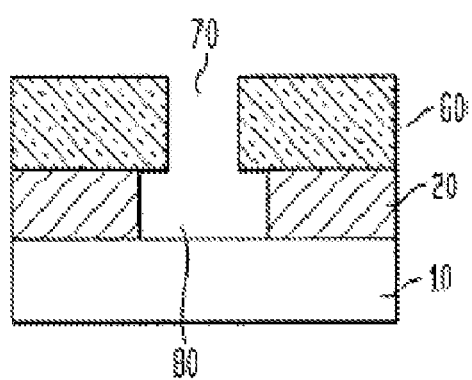
Figure 2C:
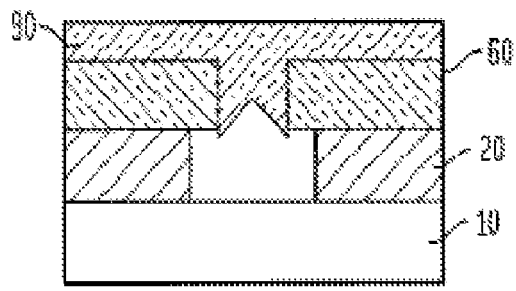

The exemplary embodiments of the invention and the various features and advantageous details thereof are explained more fully with reference to the non-limiting exemplary embodiments that are illustrated in the accompanying drawings and detailed in the following description. It should be noted that the features illustrated in the drawings are not necessarily drawn to scale. Descriptions of well-known materials, components, and processing techniques are omitted so as to not unnecessarily obscure the exemplary embodiments of the invention. The examples used herein are intended to merely facilitate an understanding of ways in which the exemplary embodiments of the invention may be practiced and to further enable those of skill in the art to practice the exemplary embodiments of the invention. Accordingly, the examples should not be construed as limiting the scope of the exemplary embodiments of the invention.

As stated above, there remains a need to generate patterns of air gaps that are independent of the wiring layout, are easily produced by conventional photolithography, and provide a uniform reduction of parasitic capacitance.

Figure 3A:
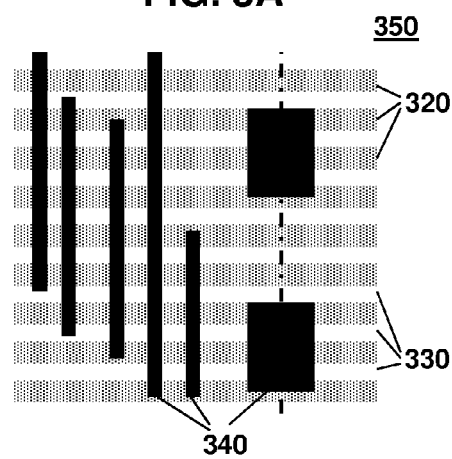
FIG. 3A illustrates a plan view of a first cross pattern of air gaps in a wiring layer 350, in which the air gaps 330 (white) may be oriented orthogonally to wires 340 (black) in an exemplary embodiment of the invention.

FIG. 3A illustrates a plan view of a first cross pattern of air gaps in a wiring layer 350, in which the air gaps 330 (white) may be oriented orthogonally to wires 340 (black) in an exemplary embodiment of the invention. As shown in FIG. 3A, a first pattern of parallel, alternating air gaps 330 and dielectric stripes 320 (dotted) may be formed in a first direction, corresponding to one of the planar axes of the wiring layer 350 of a multilayer IC. FIG. 3A also illustrates that the wires 340 may be laid out in a second direction, orthogonal to the first direction and forming a cross pattern to the alternating air gaps 330 and dielectric stripes 320, according to a corresponding uni-directional wiring rule.

Because the air gaps 330 and the dielectric stripes 320 are of approximately equal widths, about half of the first cross pattern's area may comprise air gaps 330 in an exemplary embodiment of the invention. Thus, irrespective of a particular uni-directional wiring layout, about half of the lengths of the wires 340 may be surrounded by air gaps 330. Using this first cross pattern of air gaps 330 relative to the uni-directional layout of the wires 340, a comparatively uniform reduction of parasitic capacitance between the wires 340 and the surrounding materials may be obtained. Such a reduction in parasitic capacitance may translate to power savings of about 7-15% for a multilayer IC employing the first cross pattern of air gaps in wiring layer 350 of an exemplary embodiment of the invention.

Figure 3B:
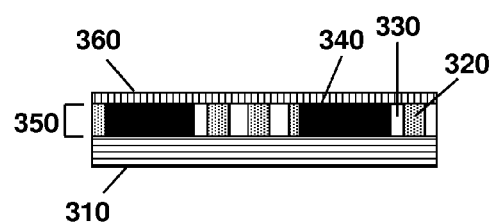
FIG. 3B illustrates a cross section of a multilayer IC through a plane of the construction line above and below the wiring layer 350 shown in FIG. 3A in an exemplary embodiment of the invention.

FIG. 3B illustrates a cross section of a multilayer IC through a plane of the construction line above and below the wiring layer 350 shown in FIG. 3A. In an exemplary embodiment of the invention, the multilayer IC may include: the wiring layer 350, comprising air gaps 330, dielectric stripes 320, and wires 340; an underlying substrate layer 310; and an overlying bridge layer 360. The air gaps 330, the dielectric stripes 320, and the wires 340 of the wiring layer 350 may be disposed above the substrate 310, which may include an inter-layer dielectric and various circuit components, ground terminals, and/or power terminals, and beneath a bridge layer 360, which caps the wiring layer 350. In various exemplary embodiments of the invention, a thin border of dielectric may be located along outer edges of the first cross pattern of air gaps 330 and dielectric stripes 320 of the wiring layer 350 to provide structural integrity for the overlying bridge layer 360.

Figure 4A:
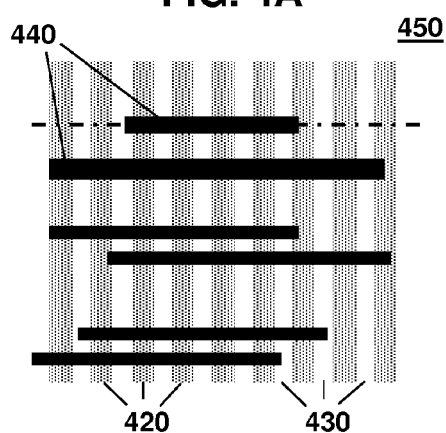
FIG. 4A illustrates a plan view of a second cross pattern of air gaps in a second wiring layer 450 disposed above the wiring layer 350 of FIGS. 3A and 3B in a multilayer IC of an exemplary embodiment of the invention.

FIG. 4A illustrates a plan view of a second cross pattern of air gaps in a second wiring layer 450 disposed above the wiring layer 350 of FIGS. 3A and 3B in a multilayer IC of an exemplary embodiment of the invention. In particular, as shown in FIG. 4A, the second cross pattern of parallel, alternating air gaps 430 (white) and dielectric stripes 420 (dotted) may be formed in a second direction, orthogonal to that of the first direction of the alternating air gaps 330 and dielectric stripes 320 of the wiring layer 350 of FIG. 3A. The air gaps 430 of the second wiring layer 450 may be oriented orthogonally to the wires 440 (black) of the second wiring layer 450. FIG. 4A also illustrates that the wires 440 of second wiring layer 450 may be oriented orthogonally to the wires 340 of the underlying wiring layer 350, as shown in FIG. 3A, according to a corresponding second uni-directional layout rule for the second wiring layer 450.

Again, the air gaps 430 and the dielectric stripes 420 of the second wiring layer 450 may be of approximately equal widths. Thus, about half of the lengths of the wires 440 may be surrounded by air gaps 430, achieving a comparatively uniform reduction of parasitic capacitance between the wires 440 and the surrounding materials.

Figure 4B:
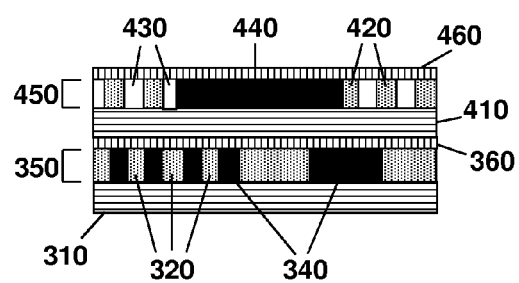
FIG. 4B illustrates a cross section of the multilayer IC through a plane of the construction line above and below the wiring layer 450 shown in FIG. 4A in an exemplary embodiment of the invention.

FIG. 4B illustrates a cross section of the multilayer IC through a plane of the construction line above and below the wiring layer 450 shown in FIG. 4A. In an exemplary embodiment of the invention, the multilayer IC may include: the second wiring layer 450, in which the second cross pattern of air gaps 430 and dielectric stripes 420 is orthogonal to that of the first cross pattern of air gaps 330 and dielectric stripes 320 of the first wiring layer 350, and in which the wiring layout of wires 440 is orthogonal to the wiring layout of wires 340 of the first wiring layer; a second bridge layer 460, which caps the second wiring layer 450; a second substrate 410 underlying the second wiring layer 450, which may include an inter-layer dielectric and various circuit components, ground terminals, and/or power terminals; the first bridge layer 360; the first wiring layer 350; and the first substrate 310. In various exemplary embodiments of the invention, a thin border of dielectric may be located along outer edges of the second cross pattern of air gaps 430 and dielectric stripes 420 of the wiring layer 450 to provide structural integrity for the overlying bridge layers 460.

The orthogonality of the first and second patterns of parallel, alternating air gaps 330, 430 and dielectric stripes 320, 420 in the first and second wiring layers 350 and 450, respectively, may provide greater structural integrity to the multilayer IC, while the orthogonality of the wiring layouts of the wires 340 and 440 of the first and second wiring layers 350 and 450, respectively, may facilitate wiring layout in the multilayer IC by providing two different unidirectional wiring layouts in the two wiring layers of an exemplary embodiment of the invention.

Figure 5A:
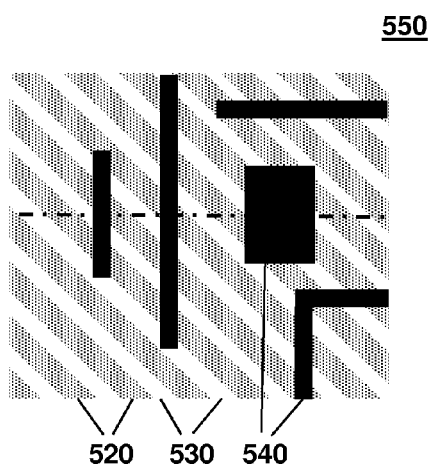
FIG. 5A illustrates a plan view of a first diagonal cross pattern of air gaps in a wiring layer 550, in which air gaps 530 (white) may be oriented diagonally to wires 540 (black) in an exemplary embodiment of the invention.

FIG. 5A illustrates a plan view of a first diagonal cross pattern of air gaps in a wiring layer 550, in which air gaps 530 (white) may be oriented diagonally to wires 540 (black) in an exemplary embodiment of the invention. As shown in FIG. 5A, a first diagonal pattern of parallel, alternating air gaps 530 and dielectric stripes 520 (dotted) may be formed in a first direction, corresponding to a direction at an angle to one of the planar axes of the wiring layer 550 of a multilayer IC. The angle of the diagonal direction to the one of the planar axes may be one of approximately plus or minus 45°. FIG. 5A also illustrates that the wires 540 may be laid out according to either a uni-directional wiring layout rule corresponding to either one of the two planar axes of the wiring layer 550, or to a bi-directional wiring layout rule including right angles, corresponding to both the two planar axes of the wiring layer 550.

The diagonally oriented air gaps 530 and dielectric stripes 520 may be of approximately equal widths, and thus, about half of the area of the wiring layer 550 may comprise air gaps 530 in an exemplary embodiment of the invention. Thus, irrespective of any particular uni- or bi-directional wiring layout, about half of the lengths of the wires 540 may be surrounded by air gaps 530. Using this first diagonal cross pattern of air gaps 530, relative to either a uni-directional or bi-directional wiring layout of the wires 540, a comparatively uniform reduction of parasitic capacitance between the wires 540 and the surrounding materials may be obtained. Such a reduction in parasitic capacitance may readily translate to power savings of approximately 7-15% for a multilayer IC employing the first diagonal cross pattern of air gaps in the wiring layer of 550 of an exemplary embodiment of the invention.

Figure 5B:
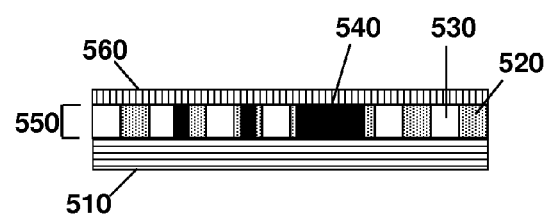
FIG. 5B illustrates a cross section of a multilayer IC through a plane of the construction line above and below the wiring layer 550 shown in FIG. 5A in an exemplary embodiment of the invention.

FIG. 5B illustrates a cross section of a multilayer IC through a plane of the construction line above and below the wiring layer 550 shown in FIG. 5A. In an exemplary embodiment of the invention, the multilayer IC may include: the wiring layer 550, comprising air gaps 530, dielectric stripes 520, and wires 540; an underlying substrate layer 510; and an overlying bridge layer 560. The air gaps 530, the dielectric stripes 520, and the wires 540 of the wiring layer 550 may be disposed above the substrate 510, which may include an inter-layer dielectric and various circuit components, ground terminals, and/or power terminals, and beneath the bridge layer 560, which caps the wiring layer 550. In various exemplary embodiments of the invention, a thin border of dielectric may be located along outer edges of the first diagonal cross pattern of air gaps 530 and dielectric stripes 320 of the wiring layer 550 to provide structural integrity for the overlying bridge layer 560.

Figure 6A:
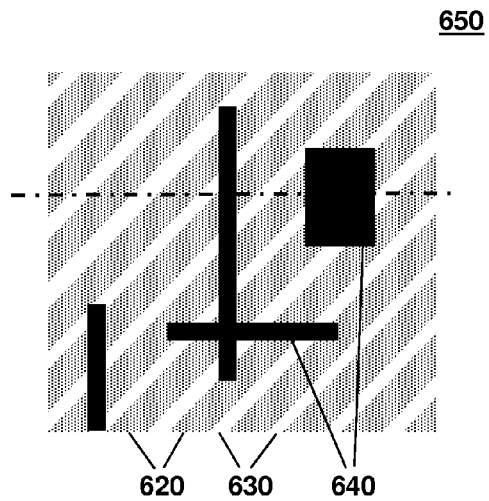
FIG. 6A illustrates a plan view of a second diagonal cross pattern of air gaps in a second wiring layer 650 disposed above the wiring layer 550 of FIGS. 5A and 5B in a multilayer IC of an exemplary embodiment of the invention.

FIG. 6A illustrates a plan view of a second diagonal cross pattern of air gaps in a second wiring layer 650 disposed above the wiring layer 550 of FIGS. 5A and 5B in a multilayer IC of an exemplary embodiment of the invention. In particular, as shown in FIG. 6A, the second diagonal pattern of parallel, alternating air gaps 630 (white) and dielectric stripes 620 (dotted) may be formed in a second direction, orthogonal to that of the first direction of the diagonally alternating air gaps 530 and dielectric stripes 520 of the wiring layer 550 of FIG. 5A. The air gaps 630 of the second wiring layer 650 may be oriented diagonally to the wires 640 of the second wiring layer 650. FIG. 6A also illustrates that the wires 640 may be laid out according to either a uni-directional wiring layout rule corresponding to one of the two planar axes of the wiring layer 650, or to a bi-directional wiring layout rule including right angles, corresponding to both the two planar axes of the wiring layer 650.

Again, the air gaps 630 and the dielectric stripes 620 of the second wiring layer 650 may be of approximately equal widths. Thus, about half of the lengths of the wires 640 may be surrounded by air gaps 630, achieving a comparatively uniform reduction of parasitic capacitance between the wires 640 and the surrounding materials.

Figure 6B:
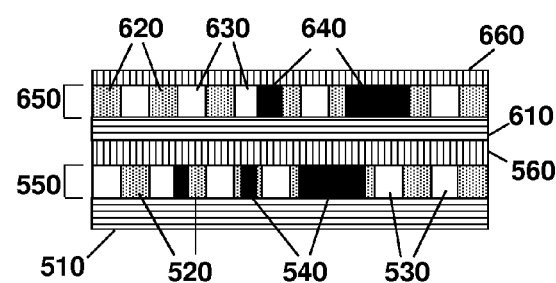
FIG. 6B illustrates a cross section of the multilayer IC through a plane of the construction line above and below the second wiring layer 650 shown in FIG. 6A in an exemplary embodiment of the invention.

FIG. 6B illustrates a cross section of the multilayer IC through a plane of the construction line above and below the second wiring layer 650 shown in FIG. 6A. In an exemplary embodiment of the invention, the multilayer IC may include: the second wiring layer 650, in which the second diagonal cross pattern of air gaps 630 and dielectric stripes 620 is orthogonal to that of the first diagonal cross pattern of air gaps 530 and dielectric stripes 520 of the first wiring layer 550; a second bridge layer 660, which caps the second wiring layer 650; a second substrate 610 underlying the second wiring layer 650, which may include an inter-layer dielectric and various circuit components, ground terminals, and/or power terminals; the first bridge layer 560; the first wiring layer 550; and the first substrate 510. In various exemplary embodiments of the invention, a thin border of dielectric may be located along outer edges of the second diagonal cross pattern of air gaps 630 and dielectric stripes 620 of the wiring layer 650 to provide structural integrity for the overlying bridge layers 660.

The orthogonality of the first and second diagonal patterns of parallel, alternating air gaps 530, 630 and dielectric stripes 520, 620 in the first and second wiring layers 550 and 650, respectively, may provide greater structural integrity to the multilayer IC in exemplary embodiments of the invention. In the case of uni-directional wiring layout rules, a first uni-directional wiring layout rule, corresponding to one of the planar axes of the wiring layer, may be used with the first diagonal pattern of the first wiring layer 550, and a second uni-directional wiring layout rule, orthogonal to that of the first uni-directional wiring layout rule, may be used with the second diagonal pattern of the second wiring layer 650. Both the first and second diagonal patterns of the first and second wiring layers 550 and 650, respectively, may be used in the case of a bi-directional wiring layout rule applied to both the first and second wiring layers 550, 650.

Figure 7A:
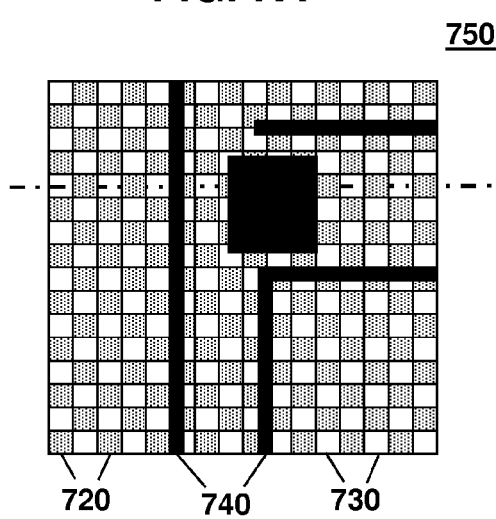
FIG. 7A illustrates a plan view of a checkerboard cross pattern of air gaps in a wiring layer 750, in which the air gaps 730 (white) may cross lengths of the wires 750 (black) in an exemplary embodiment of the invention.

FIG. 7A illustrates a plan view of a checkerboard cross pattern of air gaps in a wiring layer 750, in which the air gaps 730 (white) may cross lengths of the wires 750 (black) in an exemplary embodiment of the invention. As shown in FIG. 7A, a checkerboard pattern of alternating air gaps 730 and dielectric squares 720 (dotted) may be formed according to the two planar axes of the wiring layer 750 or at a diagonal angle to the two planar axes (not shown) of the wiring layer 750 in a multilayer IC. In an exemplary embodiment of the invention, several air gaps 730 will surround all or part of a length of a wire 750. FIG. 7A also illustrates that the wires 740 may be laid out according to either a uni-directional wiring layout rule corresponding to either one of the two planar axes of the wiring layer 750, or to a bi-directional wiring layout rule including right angles, corresponding to both the two planar axes of the wiring layer 750.

Because the air gaps 730 and the dielectric squares 720 are of approximately equal size, about half of the checkerboard cross pattern's area may comprise air gaps 730 in an exemplary embodiment of the invention. Thus, irrespective of a particular uni- or bi-directional wiring layout, about half of the lengths of the wires 740 may be surrounded by air gaps 730. Using this checkerboard cross pattern of air gaps 730 relative to either a uni- or bi-directional layout of the wires 740, a comparatively uniform reduction of parasitic capacitance between the wires 740 and the surrounding materials may be obtained. Such a reduction in parasitic capacitance may translate to power savings of about 7-15% for a multilayer IC employing the checkerboard cross pattern of air gaps in wiring layer 750 of an exemplary embodiment of the invention.

Figure 7B:
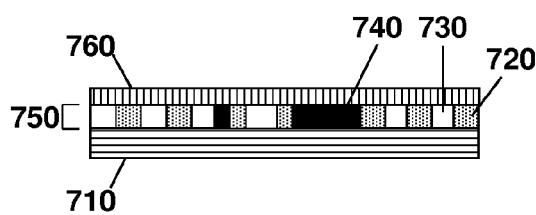
FIG. 7B illustrates a cross section of a multilayer IC through a plane of the construction line above and below the wiring layer 750 shown in FIG. 7A in an exemplary embodiment of the invention.

FIG. 7B illustrates a cross section of a multilayer IC through a plane of the construction line above and below the wiring layer 750 shown in FIG. 7A. In an exemplary embodiment of the invention, the multilayer IC may include: the wiring layer 750, comprising air gaps 730, dielectric squares 720, and wires 740; an underlying substrate layer 710; and an overlying bridge layer 760. The air gaps 730, the dielectric squares 720, and the wires 740 of the wiring layer 750 may be disposed above the substrate 710, which may include an inter-layer dielectric and various circuit components, ground terminals, and/or power terminals, and beneath a bridge layer 760, which caps the wiring layer 750. In various exemplary embodiments of the invention, a thin border of dielectric may be located along outer edges of the checkerboard cross pattern of air gaps 730 and dielectric squares 720 of the wiring layer 750 to provide structural integrity for the overlying bridge layer 760.

In various exemplary embodiments, the checkerboard cross pattern of air gaps of the wiring layer, i.e., the rows and columns of alternating, equally-sized squares, may be oriented diagonally to the two planar axes of the wiring layer.

Figure 8:
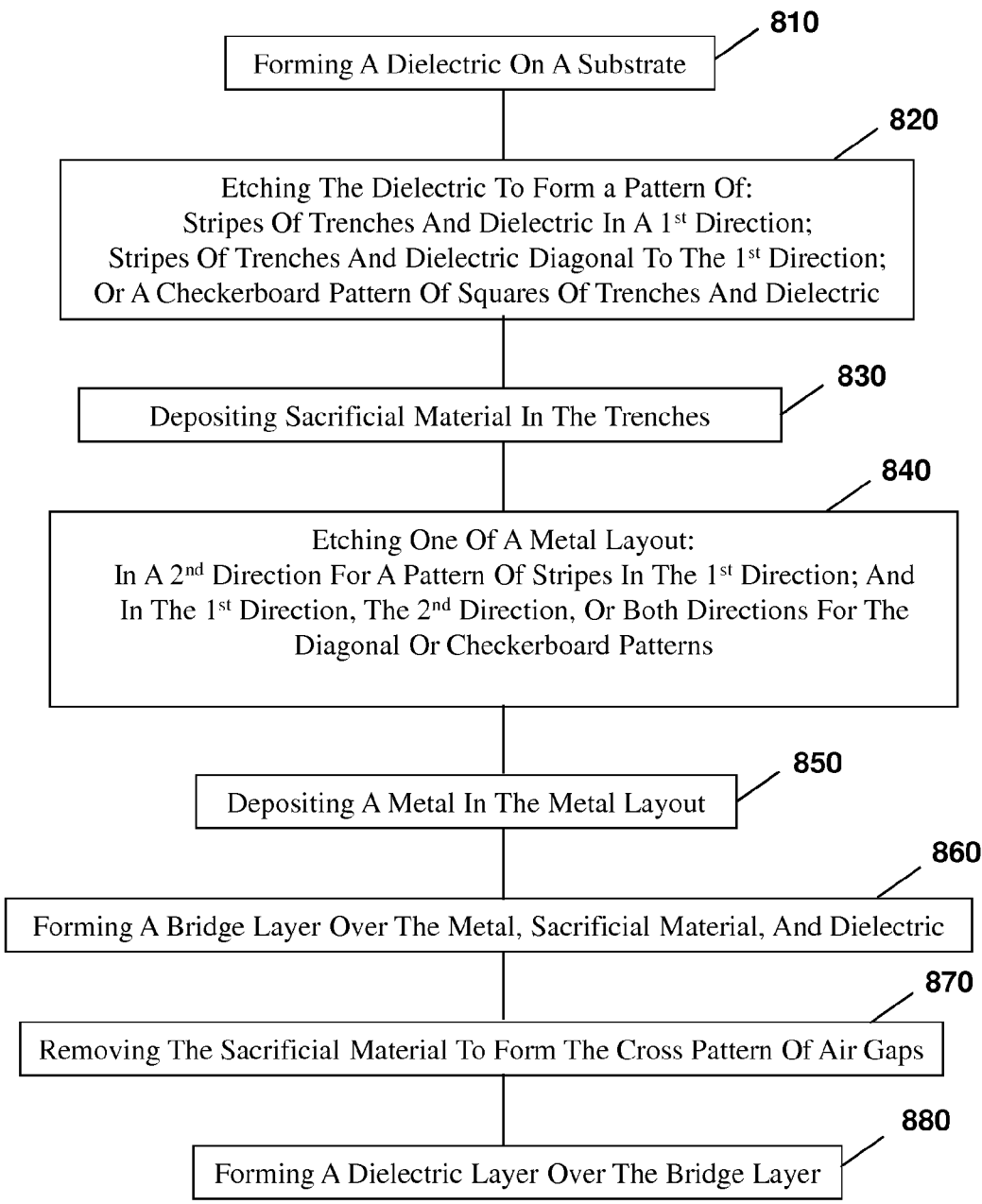
FIG. 8 illustrates a flow chart illustrating a method of making a multilayer IC including a cross pattern of air gaps in a wiring layer 800, in which a metal wiring layout may be etched into a regular pattern of alternating trenches and dielectric structures in an exemplary embodiment of the invention.

FIG. 8 illustrates a flow chart illustrating a method of making a multilayer IC including a cross pattern of air gaps in a wiring layer 800, in which a metal wiring layout may be etched into a regular pattern of alternating trenches and dielectric structures in an exemplary embodiment of the invention.

Initially, a dielectric layer may be formed on a substrate 810, where the dielectric layer extends in a first direction and in a second direction orthogonal to the first direction in a plan view. The substrate may comprise an interlevel dielectric layer and a lower layer disposed beneath the interlevel dielectric layer and including any of a power terminal, a ground terminal, and a terminal of an electronic device.

The dielectric layer may then be etched to form a regular pattern of alternating trenches and dielectric structures of approximately equal sizes. In various embodiments of the invention, the regular pattern may comprise one of: parallel, alternating trenches and dielectric stripes of approximately equal widths extending across the dielectric layer in the first direction; diagonal, parallel, alternating trenches and dielectric stripes of approximately equal widths extending across the dielectric layer diagonally to the first direction; and a checkerboard pattern of alternating trenches and dielectric squares of approximately equal sizes, 820.

A sacrificial material may then be deposited in the trenches of the dielectric layer 830 to form a regular pattern of sacrificial material, having filled the trenches, and dielectric structures.

Portions of the regular pattern of sacrificial material and the dielectric structures may then be etched to form a metal wiring layout. In various exemplary embodiments of the invention, the metal wiring layout may be patterned according to one of a uni-directional wiring rule, corresponding to the first direction or the second direction, and a bi-directional wiring layout rule including right angles extending in the first direction and the second direction, 840. About half of the total length of the metal wiring layout may be disposed in those portions of the sacrificial material, which have been etched, in various exemplary embodiments of the invention.

Metal is then deposited into the etched metal wiring layout 850.

A bridge layer, comprising a dielectric, is then formed over the deposited metal, according to the metal wiring layout, and the remaining portions of the sacrificial material and the dielectric structures 860. In various embodiments of the invention, the bridge layer may comprise one of: a permeable dielectric, which allows underlying sacrificial material to diffuse through the permeable dielectric upon oxidation and/or heating; and a perforated dielectric, which allows an aggressive process, for example, plasma-etching by a reactive gas, to remove underlying sacrificial material via a perforation. The sacrificial material is then removed from beneath the bridge layer, according to a process corresponding to the selected type of bridge layer, i.e., either a permeable bridge layer or a perforated bride layer, to form the cross pattern of air gaps in the wiring layer, 870.

A dielectric layer, which may form an interlevel dielectric layer in the case of a permeable dielectric bridge layer or a pinch-off layer in the case of a perforated dielectric bridge layer, may then be formed over the bridge layer, 880.

Figure 9:
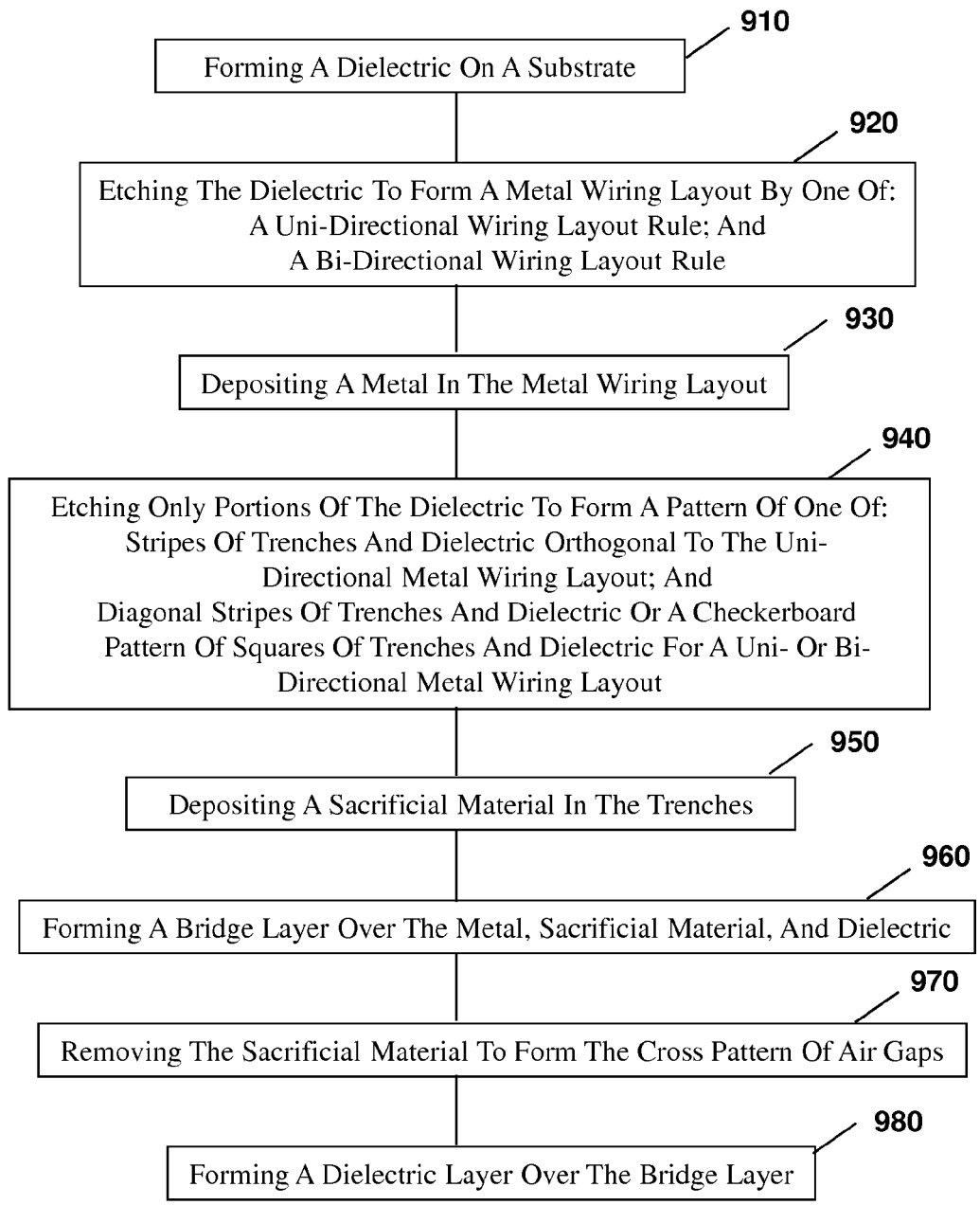
FIG. 9 illustrates a flow chart illustrating a method of making a multilayer IC including a cross pattern of air gaps in a wiring layer 900, in which a dielectric layer may be etched and filled with metal to form a metal wiring layout, and then a pattern of trenches may be further etched into the dielectric and filled with a sacrificial material to allow a cross pattern of air gaps to be subsequently formed in the wiring layer in an exemplary embodiment of the invention.

FIG. 9 illustrates a flow chart illustrating a method of making a multilayer IC including a cross pattern of air gaps in a wiring layer 900, in which a dielectric layer may be etched and filled with metal to form a metal wiring layout, and then a pattern of trenches may be further etched into the dielectric and filled with a sacrificial material to allow a cross pattern of air gaps to be subsequently formed in the wiring layer in an exemplary embodiment of the invention.

Initially, a dielectric layer may be formed on a substrate 910, where the dielectric layer extends in a first direction and in a second direction orthogonal to the first direction in a plan view. The substrate may comprise an interlevel dielectric layer and a lower layer disposed beneath the interlevel dielectric layer and including any of a power terminal, a ground terminal, and a terminal of an electronic device.

The dielectric layer may then be etched to form a metal wiring layout within the dielectric layer. In various embodiments of the invention, the metal wiring layout may be patterned according to one of: a uni-directional wiring layout rule corresponding to one of the two planar axes of the wiring layer; or a bi-directional wiring layout rule corresponding to both of the two axes of the wiring layer, 920. A metal may then be deposited in the metal wring layout to form, at this point, a wiring layer comprising metal wires and dielectric, 930.

Irrespective of the metal wiring layout in the wiring layer, portions of only the dielectric in the wiring layer may then be further etched to form a regular pattern of one of: parallel, alternating stripes of trenches and dielectric of approximately equal widths extending across the wiring layer in a direction orthogonal to the uni-directional wiring layout rule used to form the metal wiring layout, if the metal wiring layout was patterned according to the uni-directional wiring layout rule; and parallel, alternating stripes of trenches and dielectric of approximately equal widths extending across the dielectric layer diagonally to the first direction, or a checkerboard pattern of alternating, equally-sized squares of trenches and dielectric, if the metal wiring layout was patterned according to either the uni-directional wiring layout rule or to the bi-directional wiring layout rule, 940.

A sacrificial material may then be deposited in the trenches of the wiring layer, now comprising trenches, metal wires, and dielectric to form a regular cross pattern of sacrificial material in the wiring layer, 950.

A bridge layer, comprising a dielectric, is then formed over the metal wiring layout, the sacrificial material, and the remaining dielectric of the wiring layer, 960. In various embodiments of the invention, the bridge layer may comprise one of: a permeable dielectric, which allows the underlying sacrificial material to diffuse through the permeable dielectric upon oxidation and/or heating; and a perforated dielectric, which allows an aggressive process, for example, plasma-etching by a reactive gas, to remove the underlying sacrificial material via a perforation. The sacrificial material is then removed from beneath the bridge layer, according to a process corresponding to the selected type of bridge layer, i.e., either a permeable bridge layer or a perforated bride layer, to form the cross pattern of air gaps in the wiring layer, 970, in which about half of the total length of the metal wiring layout is disposed within the cross pattern of air gaps in various exemplary embodiments of the invention.

A dielectric layer, which may form an interlevel dielectric layer in the case of a permeable dielectric bridge layer or a pinch-off layer in the case of a perforated dielectric bridge layer, may then be formed over the bridge layer, 980.

What is claimed is:

1. A multilayer integrated circuit (IC) including a cross pattern of air gaps in a wiring layer, said multilayer IC comprising:

a first wiring layer disposed over a first substrate, said first wiring layer extending in a first direction and in a second direction orthogonal to said first direction in a plan view, said first wiring layer comprising:

a first diagonal pattern of parallel, alternating stripes of air gaps and dielectric of approximately equal widths extending across said first wiring layer diagonally to said first direction; and wires laid out in said first direction, said second direction, or in right angles extending in said first and said second directions, wherein each of said wires replaces portions of said first diagonal pattern of parallel, alternating stripes of air gaps and dielectric in said first wiring layer.

2. The multilayer IC of claim 1, wherein said first diagonal pattern of parallel, alternating stripes of air gaps and dielectric forms an angle to said first direction of approximately of approximately plus or minus 45°.

3. The multilayer IC of claim 1 further comprising a first bridge layer, which caps said first wiring layer.

4. The multilayer IC of claim 1, wherein said first substrate comprises:
   a first interlevel dielectric layer including a via; and
   a first lower layer disposed beneath said first interlevel dielectric layer and including any of a power terminal, a ground terminal, and a terminal of an electronic device.

5. The multilayer IC of claim 3 further comprising:
   a second substrate disposed over said first bridge layer; and
   a second wiring layer disposed over said second substrate, said second wiring layer comprising:
      a second diagonal pattern of parallel, alternating stripes of air gaps and dielectric of approximately equal widths extending across said second wiring layer and being oriented orthogonally to said first diagonal pattern; and
      wires laid out in said first direction, said second direction, or in right angles extending in said first and said second directions, wherein each of said wires replaces portions of said second diagonal pattern of parallel, alternating stripes of air gaps and dielectric in said second wiring layer.

6. The multilayer IC of claim 5 further comprising a second bridge layer, which caps said second wiring layer.

7. The multilayer IC of claim 5, wherein said second substrate comprises:
   a second interlevel dielectric layer including a via; and
   a second lower layer disposed beneath said second interlevel dielectric layer and including any of a power terminal, a ground terminal, and a terminal of an electronic device.

* * * * *